(12) United States Patent
Miyazaki et al.

(10) Patent No.: US 8,456,612 B2
(45) Date of Patent: Jun. 4, 2013

(54) EXPOSURE APPARATUS AND METHOD OF MANUFACTURING DEVICE

(75) Inventors: Kyoichi Miyazaki, Utsunomiya (JP); Kiyoshi Fukami, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 400 days.

(21) Appl. No.: 12/791,539

(22) Filed: Jun. 1, 2010

(65) Prior Publication Data

US 2010/0302517 A1 Dec. 2, 2010

(30) Foreign Application Priority Data

Jun. 1, 2009 (JP) .................. 2009-132427

(51) Int. Cl.
G03B 27/42 (2006.01)
G03B 27/70 (2006.01)
G02B 7/182 (2006.01)
G02B 5/10 (2006.01)
G03F 7/20 (2006.01)

(52) U.S. Cl.
CPC ........ G03F 7/70225 (2013.01); G03F 7/70258 (2013.01); G03F 7/70825 (2013.01); G03F 7/70833 (2013.01)
USPC ................. 355/60; 355/53; 355/66; 359/850; 359/859; 359/871; 359/874

(58) Field of Classification Search
CPC .............. G03F 7/70258; G03F 7/70225; G03F 7/70825; G03F 7/70833
USPC .................. 355/53, 55, 60, 66, 69; 359/703, 359/811, 850, 854–859, 861, 871–874; 248/466
See application file for complete search history.

(56) References Cited

U.S. PATENT DOCUMENTS

| 4,215,934 A | * | 8/1980 | Karasawa et al. ............... 355/51 |
| 4,705,940 A | * | 11/1987 | Kohno .............................. 355/55 |
| 5,636,003 A | * | 6/1997 | Tanitsu et al. .................... 355/67 |
| 6,043,863 A | * | 3/2000 | Ikeda .............................. 355/53 |

(Continued)

FOREIGN PATENT DOCUMENTS

| JP | 10-256147 A | 9/1998 |
| JP | 2000-28898 A | 1/2000 |

(Continued)

OTHER PUBLICATIONS

Japanese Office Action for corresponding JP 2009-132427, dated Jan. 6, 2012.

(Continued)

*Primary Examiner* — Steven H Whitesell Gordon
(74) *Attorney, Agent, or Firm* — Rossi, Kimms & McDowell LLP

(57) ABSTRACT

An exposure apparatus projects a pattern of an original onto a substrate by a projection optical system to expose the substrate, wherein the projection optical system includes a mirror assembly, and the mirror assembly includes a first mirror member which has a first reflecting surface and is configured to bend an optical axis of the projection optical system, a second mirror member which has a second reflecting surface and is configured to bend the optical axis, a supporting mechanism configured to support the first mirror member and the second mirror member, and the supporting mechanism is positioned to position the first mirror member and the second mirror member while a positional relationship between the first mirror member and the second mirror member is maintained.

10 Claims, 12 Drawing Sheets

U.S. PATENT DOCUMENTS

| | | | |
|---|---|---|---|
| 6,529,264 B1* | 3/2003 | Ikeda | 355/53 |
| 2004/0001191 A1* | 1/2004 | Kohda et al. | 355/53 |
| 2004/0218162 A1* | 11/2004 | Whitney | 355/54 |
| 2006/0044535 A1* | 3/2006 | Gruhlke et al. | 355/52 |
| 2006/0092393 A1* | 5/2006 | Harmed et al. | 355/53 |

FOREIGN PATENT DOCUMENTS

| | | | |
|---|---|---|---|
| JP | 2003124095 A | * | 4/2003 |
| JP | 3445021 B2 | | 9/2003 |
| JP | 2004-363571 A | | 12/2004 |
| JP | 2005-345582 A | | 12/2005 |
| JP | 2006-073905 A | | 3/2006 |
| JP | 2008-249772 A | | 10/2008 |
| WO | 2007/056557 A1 | | 5/2007 |

OTHER PUBLICATIONS

Office Action issued in corresponding Japanese Patent Application No. 2009-132427 dated Apr. 28, 2011.

Japanese Office Action for corresponding JP 2009-132427, mail date Jul. 2, 2012.

* cited by examiner

F I G. 3A
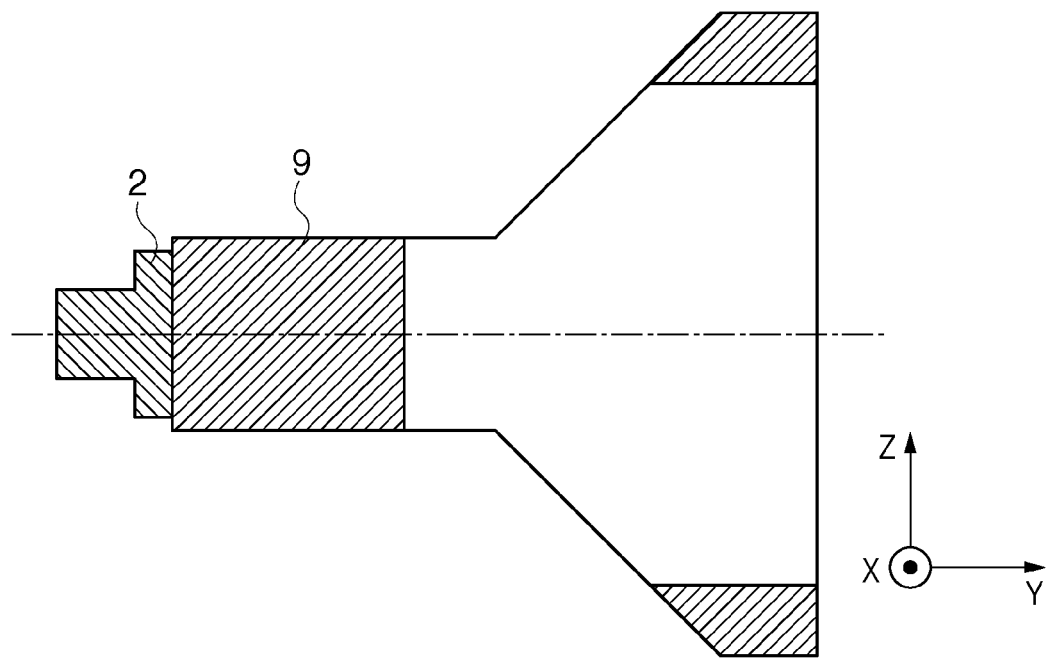
F I G. 3B
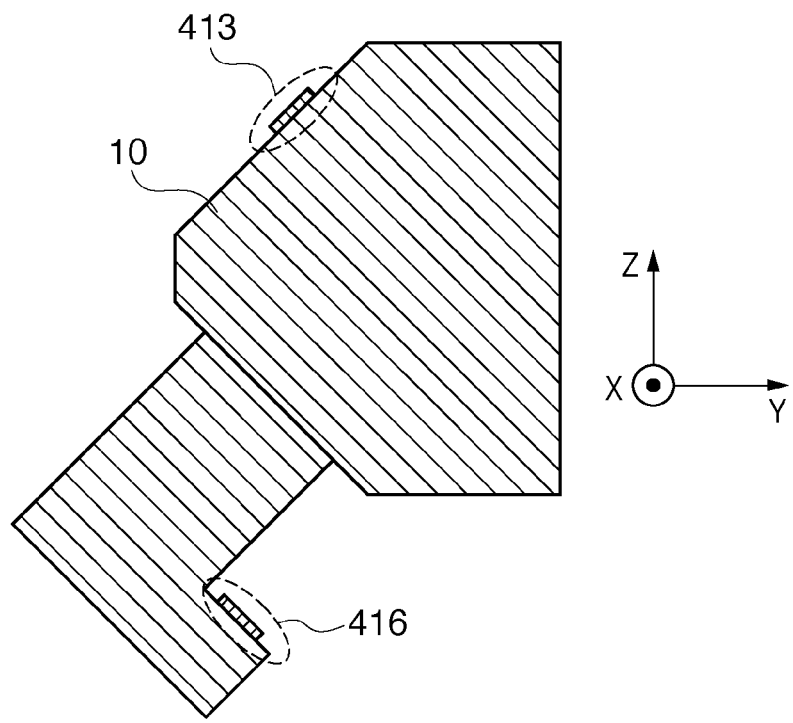

F I G. 10
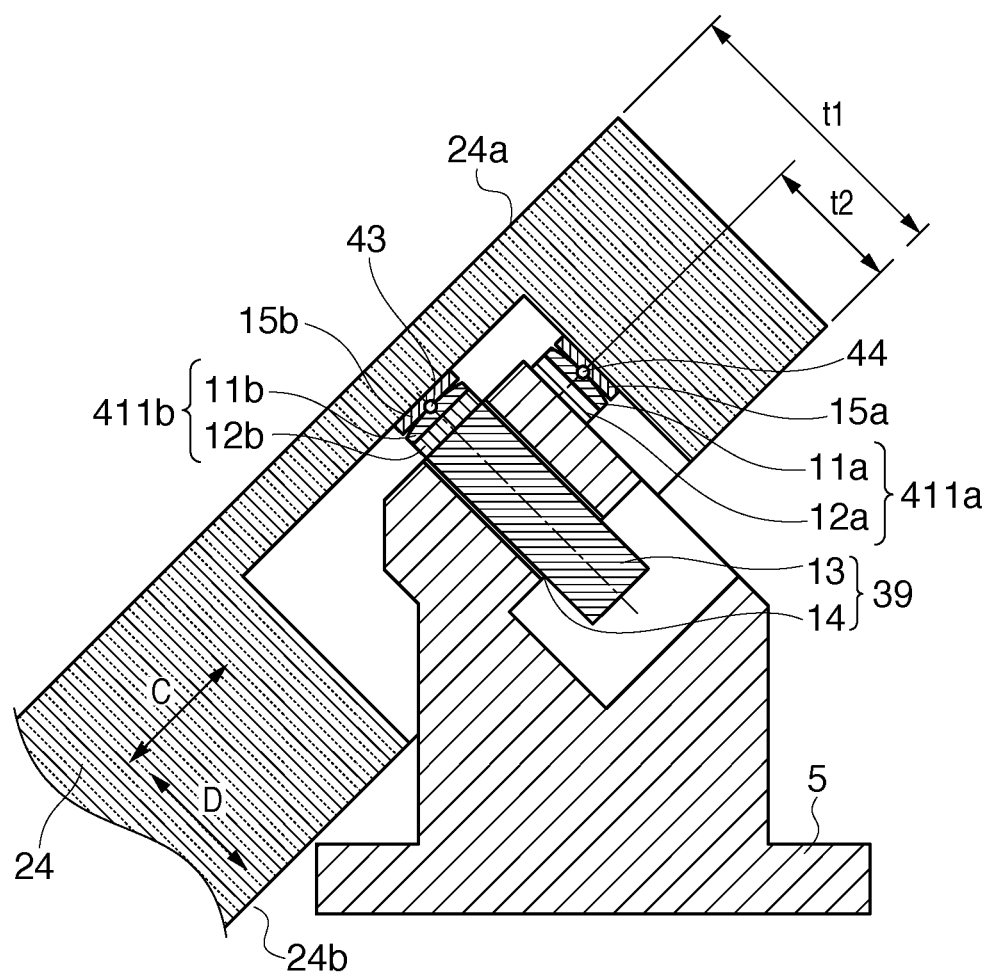

EXPOSURE APPARATUS AND METHOD OF MANUFACTURING DEVICE

BACKGROUND OF THE INVENTION

1. Field of the Invention

The present invention relates to an exposure apparatus that projects the pattern of an original onto a substrate by a projection optical system to expose the substrate, and a method of manufacturing a device using the same.

2. Description of the Related Art

A projection optical system of an exposure apparatus employed to manufacture flat panel displays such as a liquid crystal display includes a reflecting mirror, concave mirror, convex mirror, concave mirror, and reflecting mirror in turn from the object plane to the image plane. The two reflecting mirrors are used to bend the optical axis of the projection optical system. The exposure region of an exposure apparatus for manufacturing flat panel displays is widening to meet demands for, for example, an increase in size of displays and a reduction in manufacturing cost. To widen the exposure region, it is necessary to increase the sizes of optical elements which constitute a projection optical system. As the sizes of optical elements increase, that of a manufacturing apparatus for manufacturing them, in turn, increases.

Conventionally, two bending mirrors built in a projection optical system are often manufactured to have an integrated structure in which their reflecting surfaces form a right angle with each other. Unfortunately, a demand for widening the exposure region has made it difficult to manufacture two bending mirrors having such an integrated structure.

Japanese Patent No. 3445021 discloses a mirror optical system including two separate reflecting mirrors as bending mirrors. However, Japanese Patent No. 3445021 neither discloses nor suggests details of a supporting mechanism which supports the two reflecting mirrors for bending the optical axis.

SUMMARY OF THE INVENTION

The present invention provides an exposure apparatus including a projection optical system that is easy to manufacture.

One of the aspects of the present invention provides an exposure apparatus that projects a pattern of an original onto a substrate by a projection optical system to expose the substrate, the projection optical system including a mirror assembly, and the mirror assembly including a first mirror member which has a first reflecting surface and is configured to bend an optical axis of the projection optical system, a second mirror member which has a second reflecting surface and is configured to bend the optical axis, and a supporting mechanism configured to support the first mirror member and the second mirror member, wherein the supporting mechanism is positioned to position the first mirror member and the second mirror member while a positional relationship between the first mirror member and the second mirror member is maintained.

Further features of the present invention will become apparent from the following description of exemplary embodiments with reference to the attached drawings.

BRIEF DESCRIPTION OF THE DRAWINGS

FIG. 3A is a view illustrating the structure of a shaft base;

FIG. 3B is a view illustrating the structure of a supporting member;

FIG. 10 is a view illustrating the structure in which the supporting member disposed in the upper portion of the base member supports the first mirror member;

DESCRIPTION OF THE EMBODIMENTS

Figure 11:
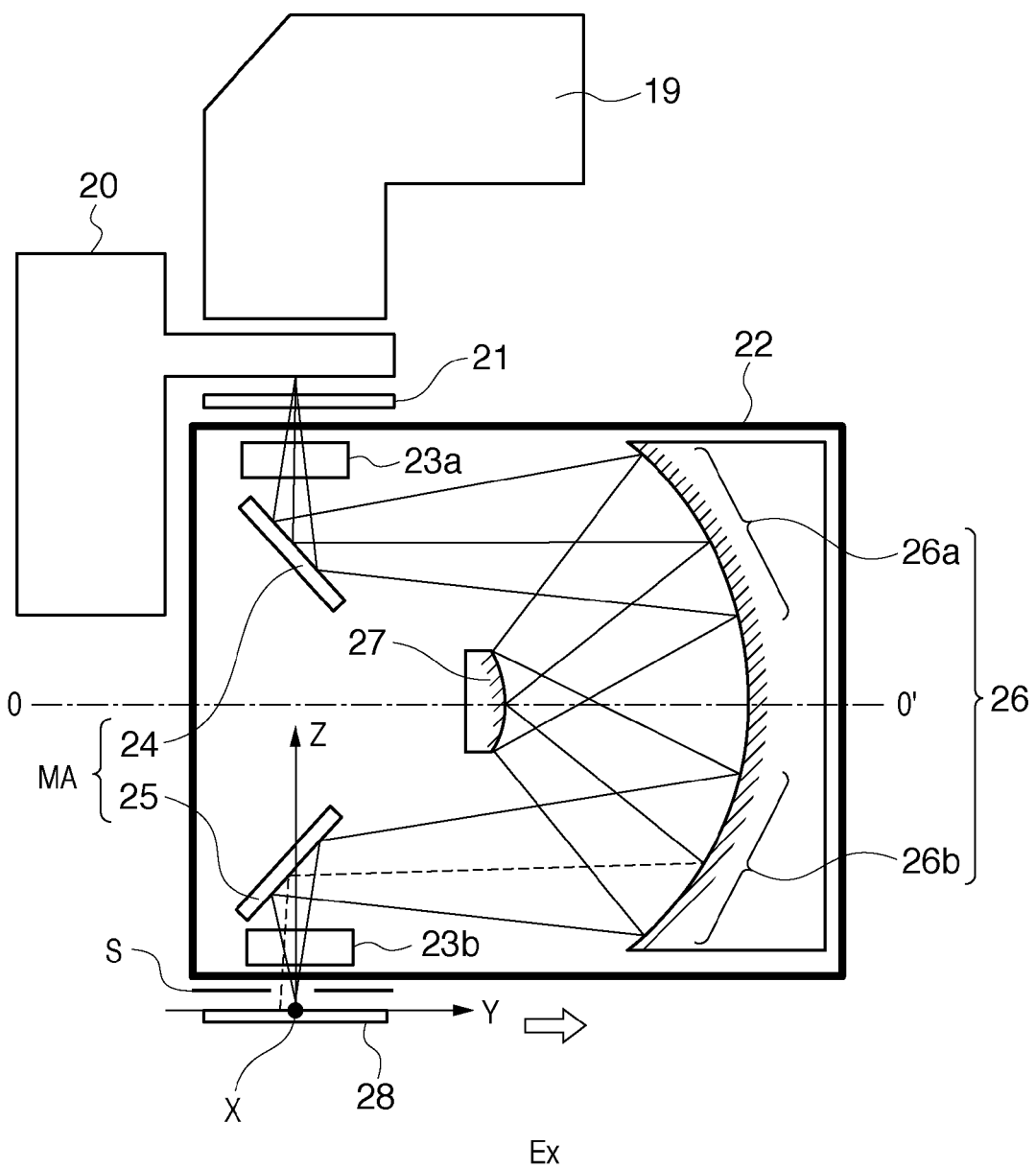
FIG. 11 is a view showing the arrangement of an exposure apparatus according to one embodiment of the present invention.

The arrangement of an exposure apparatus EX according to one embodiment of the present invention will be explained with reference to FIG. 11. The exposure apparatus EX includes an illumination optical system 19 which illuminates an original (reticle) 21, and a projection optical system 22 which projects the pattern of the original 21 onto a substrate (plate) 28. The original 21 is placed on the object plane of the projection optical system 22 by an original stage, and the substrate 28 is placed on the image plane of the projection optical system 22 by a substrate stage. The exposure apparatus EX is typically a scanning exposure apparatus and transfers the pattern of the original 21 onto the substrate 28 while scanning the original 21 and substrate 28. The exposure apparatus EX can include an alignment scope 20 for measuring the positional relationship between the original 21 and the substrate 28.

The projection optical system 22 includes a mirror assembly MA. The mirror assembly MA includes a first mirror member 24 having a first reflecting surface, and a second mirror member 25 having a second reflecting surface. The first reflecting surface and the second reflecting surface serve to bend the optical axis of the projection optical system 22. The first mirror member 24 bends the optical axis from the upper side in the vertical direction (the direction of gravity) to the horizontal direction. The second mirror member 25 bends the optical axis from the horizontal direction to the lower side in the vertical direction. The projection optical system 22 can also include a first concave reflecting surface 26a, convex reflecting surface 27, and second concave reflecting surface 26b. The first concave reflecting surface 26a and second concave reflecting surface 26b may be set in different regions on one concave reflecting mirror 26. The first reflecting surface of the first mirror member 24, the first concave reflecting surface 26a, the convex reflecting surface 27, the second concave reflecting surface 26b, and the second reflecting surface of the second mirror member 25 are inserted between the object plane and image plane of the projection optical system 22 in turn from the object plane to the image plane. A transmissive optical element 23a such as plane-parallel plate glass can be inserted between the object plane of the projection optical system 22 and the first mirror member 24. A transmissive optical element 23b such as plane-parallel plate glass can be inserted between the second mirror member 25 and the image plane of the projection optical system 22.

An example of the arrangement of the mirror assembly MA will be explained with reference to FIGS. 1A, 1B, 2A, and 2B. The mirror assembly MA includes the first mirror member 24 which has a first reflecting surface 24a and bends the optical axis of the projection optical system 22, the second mirror member 25 which has a second reflecting surface 25a and further bends the optical axis, and a supporting mechanism S which supports the first mirror member 24 and second mirror member 25. The first mirror member 24 and second mirror member 25 are preferably made of, for example, glass ceramics (linear expansion coefficient: about 0.1 ppm/° C.) such as Zerodur available from Schott or Clearceram available from Ohara. A base member 4 is preferably made of, for example, zero-expansion ceramics (linear expansion coefficient: 0.1 ppm/° C.) such as Super-Invar or cordierite available from Kyocera.

The supporting mechanism S is positioned to position the first mirror member 24 and second mirror member 25 while the positional relationship between the first mirror member 24 and the second mirror member 25 is maintained. The positioning means herein determining at least one of the position and the orientation. The supporting mechanism S has, for example, shafts 2 and 3 located on a straight line parallel to the Y-axis, and is supported by a frame 1 through the shafts 2 and 3. The shaft 2 can be fixed on, for example, a shaft base 9 fixed on the base member 4. The shaft 3 can be directly fixed on the base member 4.

The frame 1 constitutes a part of the lens barrel of the projection optical system 22. The rotation angle (orientation) of the supporting mechanism S can be adjusted by, for example, rotationally driving the shafts 2 and 3 about an axis parallel to the Y-axis or adjusting the rotation angles of the shafts 2 and 3. The supporting mechanism S includes the base member 4 and supporting members 5, 6, 10, 30, and 31 fixed on the base member 4. The first mirror member 24 is supported by the supporting members 5, 6, and 10, and the second mirror member 25 is supported by the supporting members 10, 30, and 31. In this example, the supporting member 10 disposed at the central portion is configured to support the first mirror member 24 and second mirror member 25. However, the supporting member 10 may be divided into a member that supports the first mirror member 24 and that which supports the second mirror member 25.

Figure 1A:
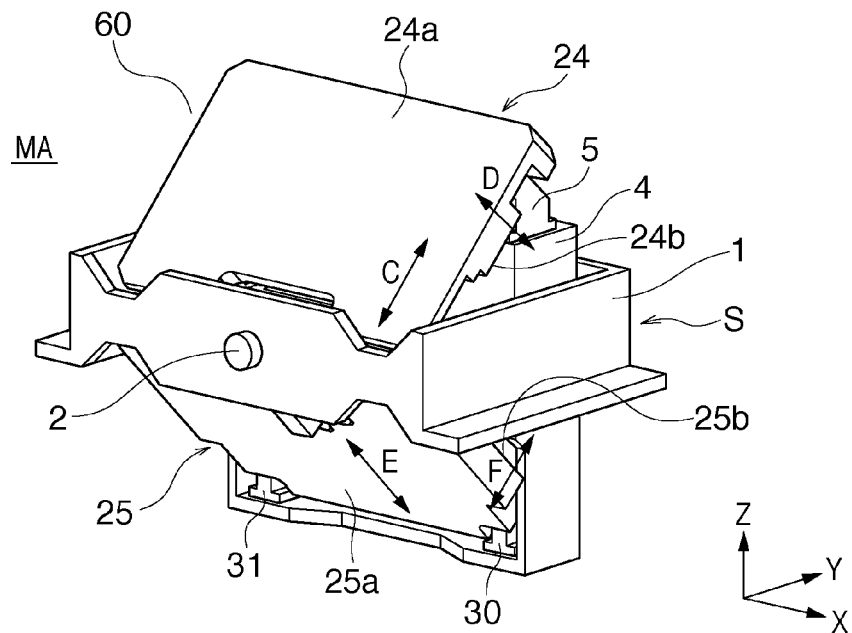
FIGS. 1A and 1B are perspective views showing a mirror assembly and a frame which supports it according to the first embodiment.
Figure 1B:
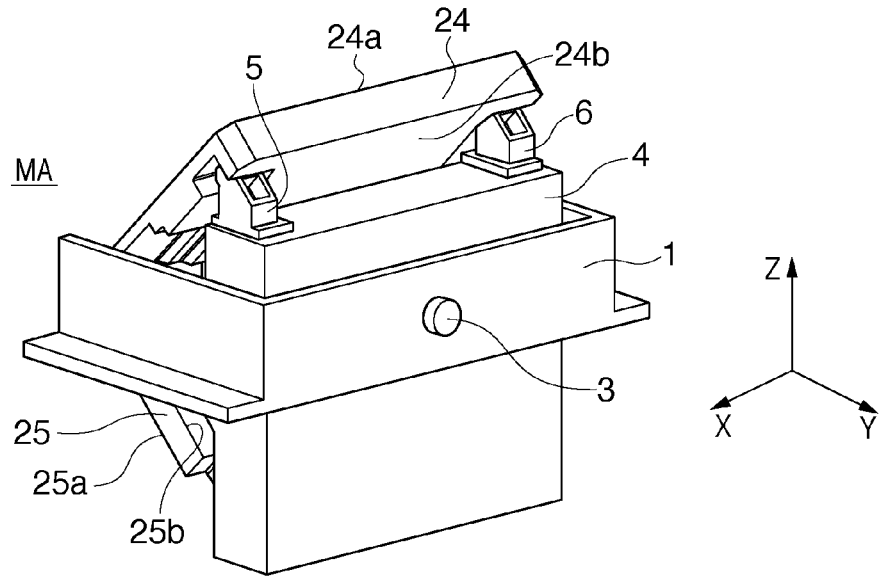
Figure 2A:
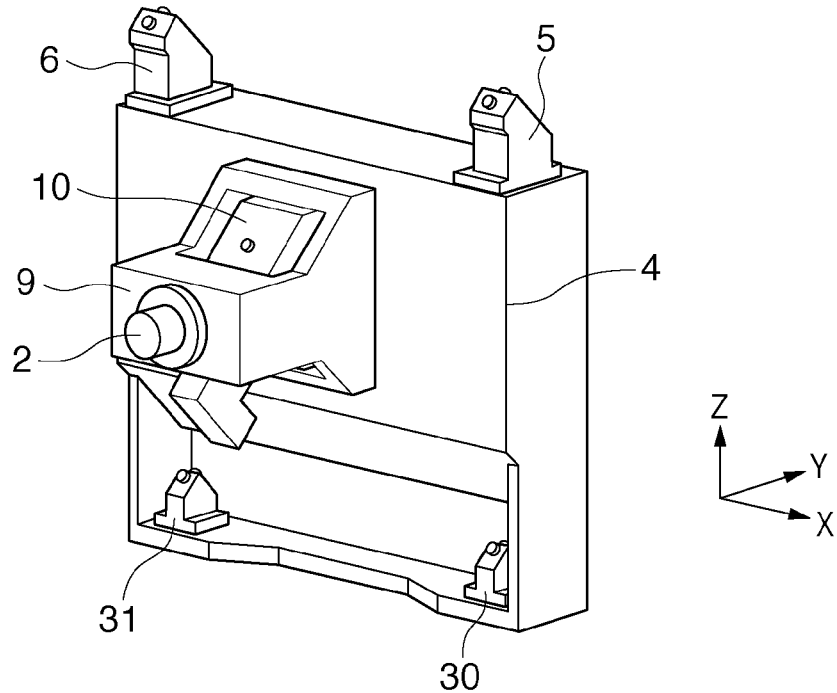
FIGS. 2A and 2B are perspective views showing the state in which first and second mirror members are detached from the mirror assembly according to the first embodiment.
Figure 2B:
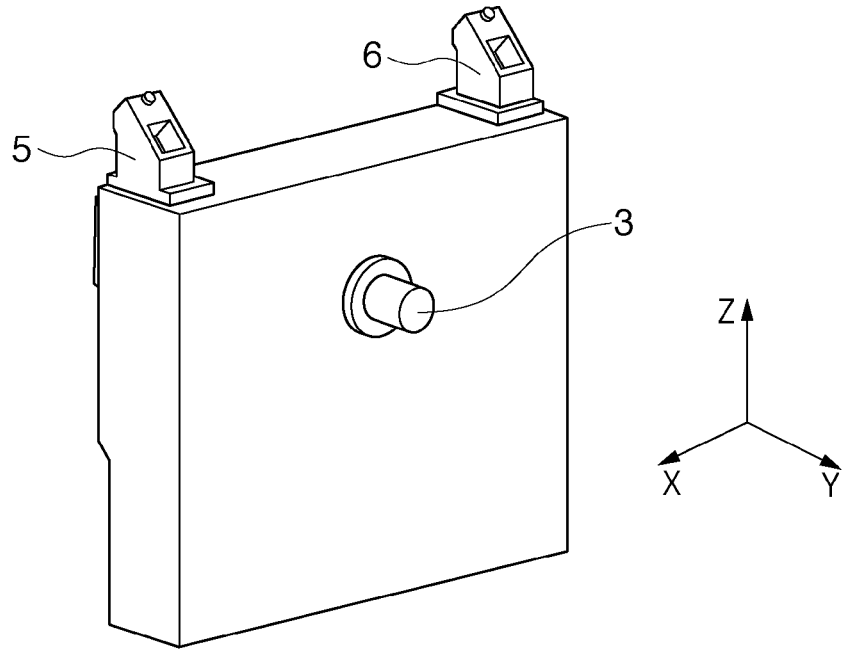
Figure 4:
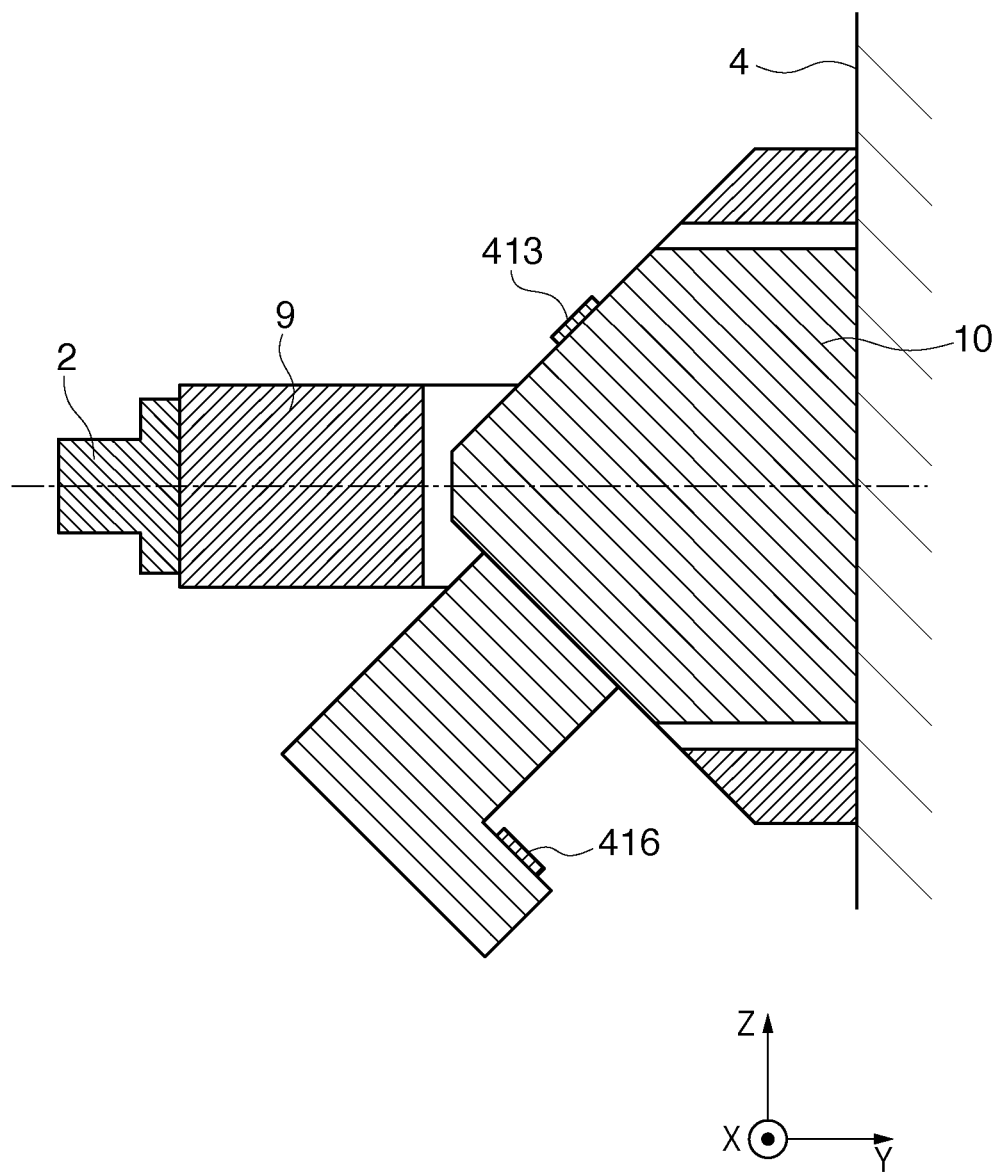
FIG. 4 is a view illustrating the shaft base and supporting member fixed on a base member.

An example of the arrangement of the shaft base 9 and supporting member 10 will be explained with reference to FIGS. 3 and 4. The supporting member 10 disposed at the central portion includes a receptacle 413 which supports the first mirror member 24 disposed on the upper side, and a receptacle 416 which supports the second mirror member 25 disposed on the lower side. The shaft base 9 and supporting member 10 are preferably made of zero-expansion ceramics (linear expansion coefficient: 0.1 ppm/° C.) such as Super-Invar or cordierite available from Kyocera.

Figure 5A:
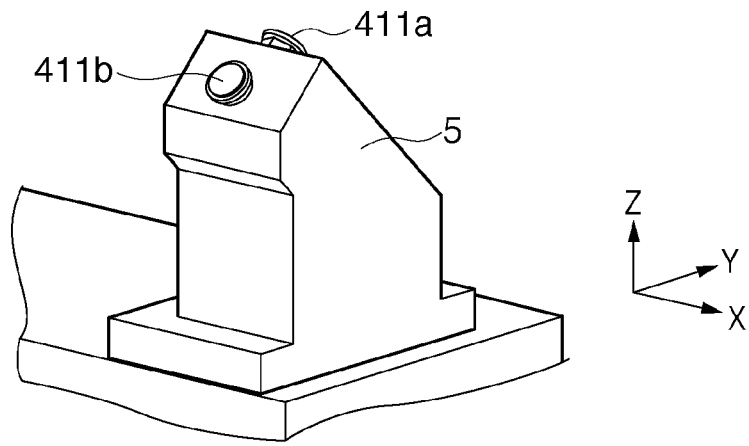
FIGS. 5A and 5B are views illustrating the structure in which a supporting member disposed in the upper portion of the base member supports the first mirror member.
Figure 5B:
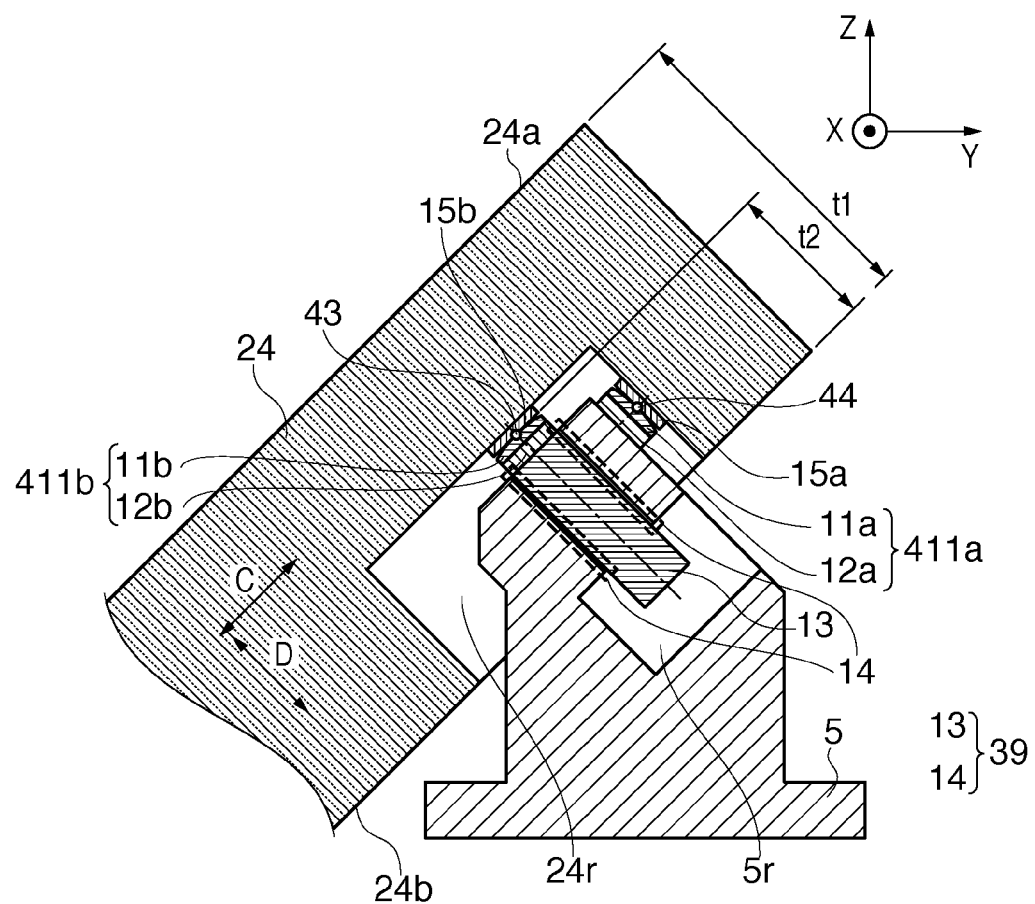

The structure in which the supporting member 5 disposed in the upper portion of the base member 4 supports the first mirror member 24 will be explained with reference to FIGS. 5A and 5B. Note that the supporting member 6 disposed in the upper portion of the base member 4 as well can have an arrangement symmetrical about that of the supporting member 5. The first mirror member 24 has first supported points 43 and 44 between a plane to which the first reflecting surface 24a serving as its reflecting surface belongs and that to which a first lower surface 24b opposite to the first reflecting surface 24a belongs, and is supported by the supporting mechanism S (supporting members 5 and 6) at the first supported points 43 and 44. The first mirror member 24 has a first recess 24r in the first lower surface 24b, and the first supported points 43 and 44 are located in the first recess 24r. Attachment portions 15a and 15b are fixed on the side surface and bottom surface, respectively, of the first recess 24r of the first mirror member 24. The attachment portions 15a and 15b can be fixed into the first recess 24r by, for example, mechanical fastening using, for example, a screw or an adhesive. The adhesive is desirably of a low gas emission type in order to prevent fogging of the optical elements, which constitute the projection optical system 22.

A receptacle 411a supports the first supported point 44 (attachment portion 15a) of the first mirror member 24. The receptacle 411a includes, for example, a pedestal 12a fixed on the supporting member 5 and a spherical member 11a fixed on the pedestal 12a, and supports the first supported point 44 (attachment portion 15a) of the first mirror member 24 by the spherical surface of the spherical member 11a. The receptacle 411a determines the position of the first mirror member 24 in a direction C parallel to the first reflecting surface 24a of the first mirror member 24.

A receptacle 411b supports the first supported point 43 (attachment portion 15b) of the first mirror member 24. The receptacle 411b includes, for example, a pedestal 12b fixed on the supporting member 5 and a spherical member 11b fixed on the pedestal 12b, and supports the first supported point 43 (attachment portion 15b) of the first mirror member 24 by the spherical surface of the spherical member 11b. The receptacle 411b determines the position of the first mirror member 24 in a direction (direction of thickness) D perpendicular to the first reflecting surface 24a of the first mirror member 24. An adjusting mechanism 39 can adjust the position of the receptacle 411b in the direction D (the position of the spherical surface of the spherical member 11b). The adjusting mechanism 39 includes, for example, an internal threaded portion 14 formed in the supporting member 5 and an external threaded portion 13 screwed into it, and the pedestal 12b is coupled to the external threaded portion 13. The external threaded portion 13 is rotated to adjust the position of the receptacle 411b in the direction D (the position of the spherical surface of the spherical member 11b). This makes it possible to adjust the position of the first reflecting surface 24a of the first mirror member 24 in the direction D. The supporting member 5 includes an access portion 5r to rotate the external threaded portion 13. The angle of the first reflecting surface 24a about an axis parallel to the X-axis can be adjusted by adjusting the position of the first reflecting surface 24a of the first mirror member 24 in the direction D.

The supporting members 5 and 6, the pedestals 12a and 12b, the spherical members 11a and 11b, the adjusting mechanism 39, and the attachment portions 15a and 15b are preferably made of zero-expansion ceramics (linear expansion coefficient: 0.1 ppm/° C.) such as Super-Invar or cordierite available from Kyocera.

Figure 6:
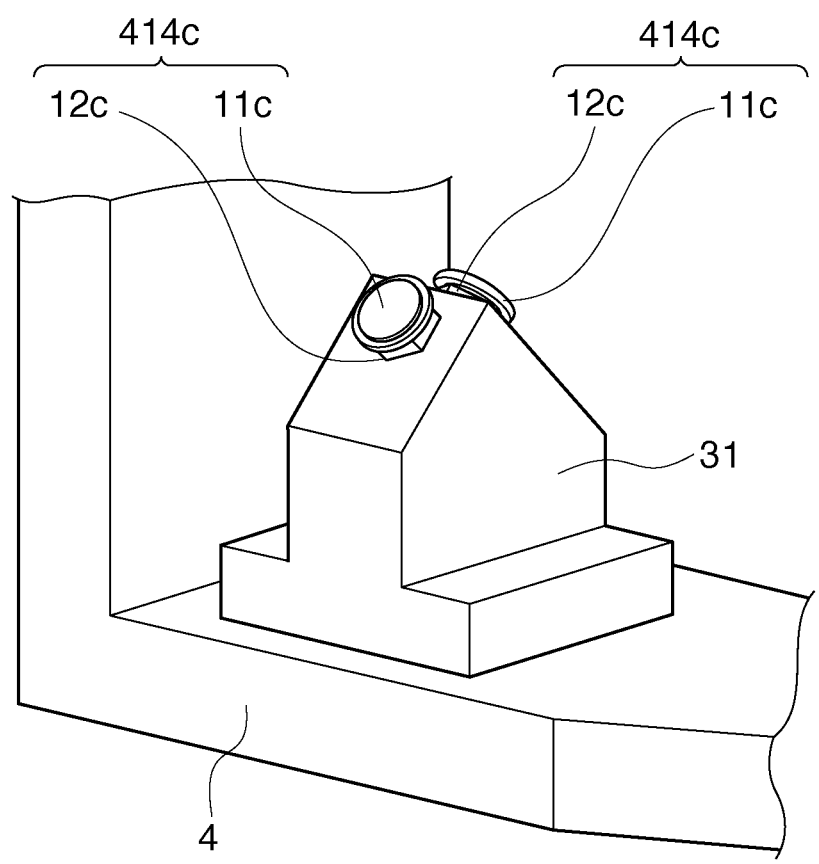
FIG. 6 is a view illustrating the arrangement of a supporting member disposed in the lower portion of the base member.

The structure in which the supporting member 31 disposed in the lower portion of the base member 4 supports the second mirror member 25 will be explained with reference to FIGS. 6 and 8. Note that the supporting member 30 disposed in the lower portion of the base member 4 as well can have an arrangement symmetrical about that of the supporting member 31. Like the first mirror member 24, the second mirror member 25 has second supported points between a plane to which the second reflecting surface 25a serving as its reflecting surface belongs and that to which a second lower surface 25b opposite to the second reflecting surface 25a belongs, and attachment portions 15 are fixed at the second supported points. The supporting mechanism S (more specifically, the supporting members 30, 31, and 10) supports the second mirror member 25 at the second supported points. The second mirror member 25 has a second recess 25r in the second reflecting surface 25a, and the second supported points at which the attachment portions 15 are fixed are located in the second recess 25r. Attachment portions 15 are fixed in the two side surfaces and two bottom surfaces of second recesses 25r in the second mirror member 25.

Receptacles 414c support the attachment portions 15 fixed at the second supported points in the second recess 25r in the second mirror member 25. Each of the receptacles 414c includes, for example, a pedestal 12c fixed on the supporting member 31 and a spherical member 11c fixed on the pedestal 12c, and supports the attachment portion 15 (second supported point) of the second mirror member 25 by the spherical surface of the spherical member 11c. The supporting members 31 and 30, the pedestal 12c, the spherical member 11c, and the attachment portions 15 are preferably made of, for example, zero-expansion ceramics (linear expansion coefficient: 0.1 ppm/° C.) such as Super-Invar or cordierite available from Kyocera.

Figure 7:
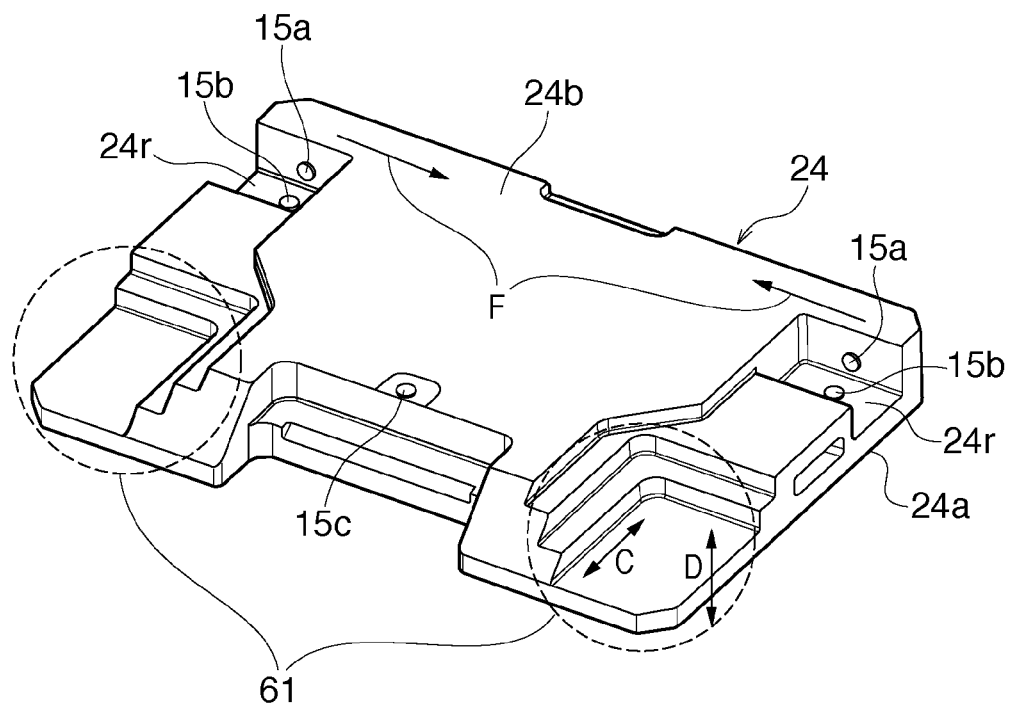
FIG. 7 is a perspective view illustrating the structure of the first mirror member disposed on the upper side.

FIG. 7 illustrates the structure of the first mirror member 24 disposed on the upper side. The first mirror member 24 includes two first recesses 24r in the first lower surface 24b serving as its lower surface, and the attachment portions 15a and 15b are fixed on their side surfaces and bottom surfaces, respectively. That is, the first mirror member 24 includes four attachment portions 15 (two attachment portions 15a and two attachment portions 15b) between a plane to which the first reflecting surface 24a belongs and that to which the first lower surface 24b belongs. The first mirror member 24 also includes one attachment portion 15c on the first lower surface 24b, and the attachment portion 15c is supported by a receptacle 413b fixed on the supporting member 10. In other words, the first mirror member 24 includes a total of five attachment portions 15 and is supported by the supporting mechanism S through the five attachment portions.

Figure 8:
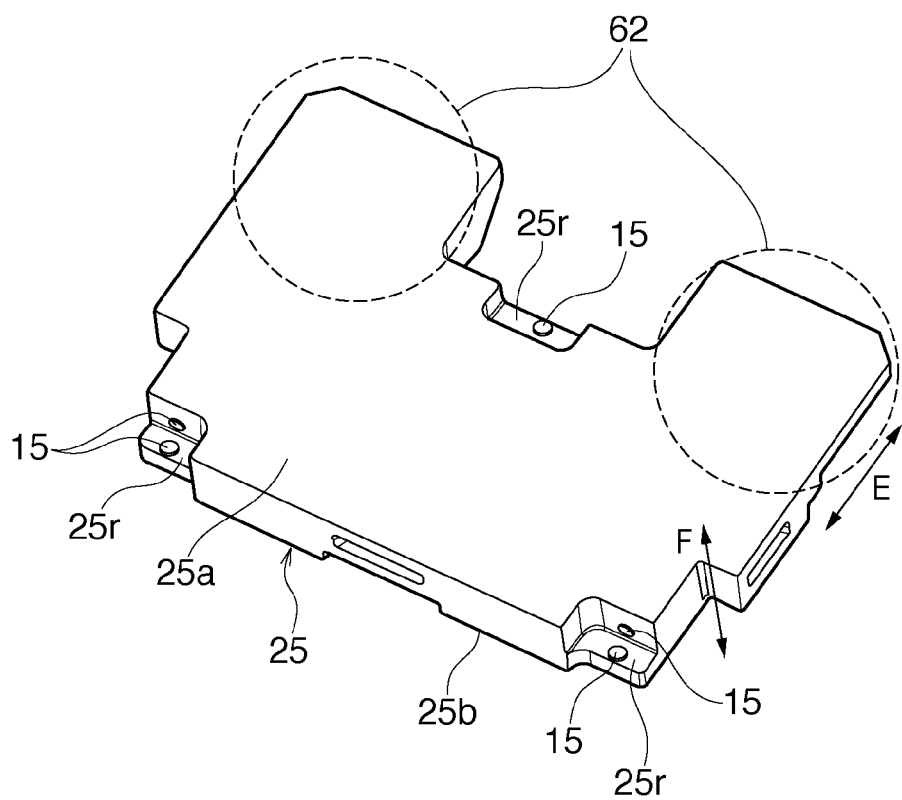
FIG. 8 is a perspective view illustrating the structure of the second mirror disposed on the lower side.

FIG. 8 illustrates the structure of the second mirror member 25 disposed on the lower side. The second mirror member 25 includes three second recesses 25r in the second reflecting surface 25a serving as its upper surface. The attachment portions 15 are fixed on the side surfaces and bottom surfaces of the two second recesses 25r, positioned on the upper side when the supporting mechanism S supports the supporting member 5, of the three second recesses 25r. One attachment portion 15 can be fixed on the bottom surface of one second recess 25r, positioned on the lower side when the supporting mechanism S supports the second mirror member 25, of the three second recesses 25r. In other words, the second mirror member 25 includes a total of five attachment portions 15 and is supported by the supporting mechanism S through the five attachment portions 15.

Figure 9:
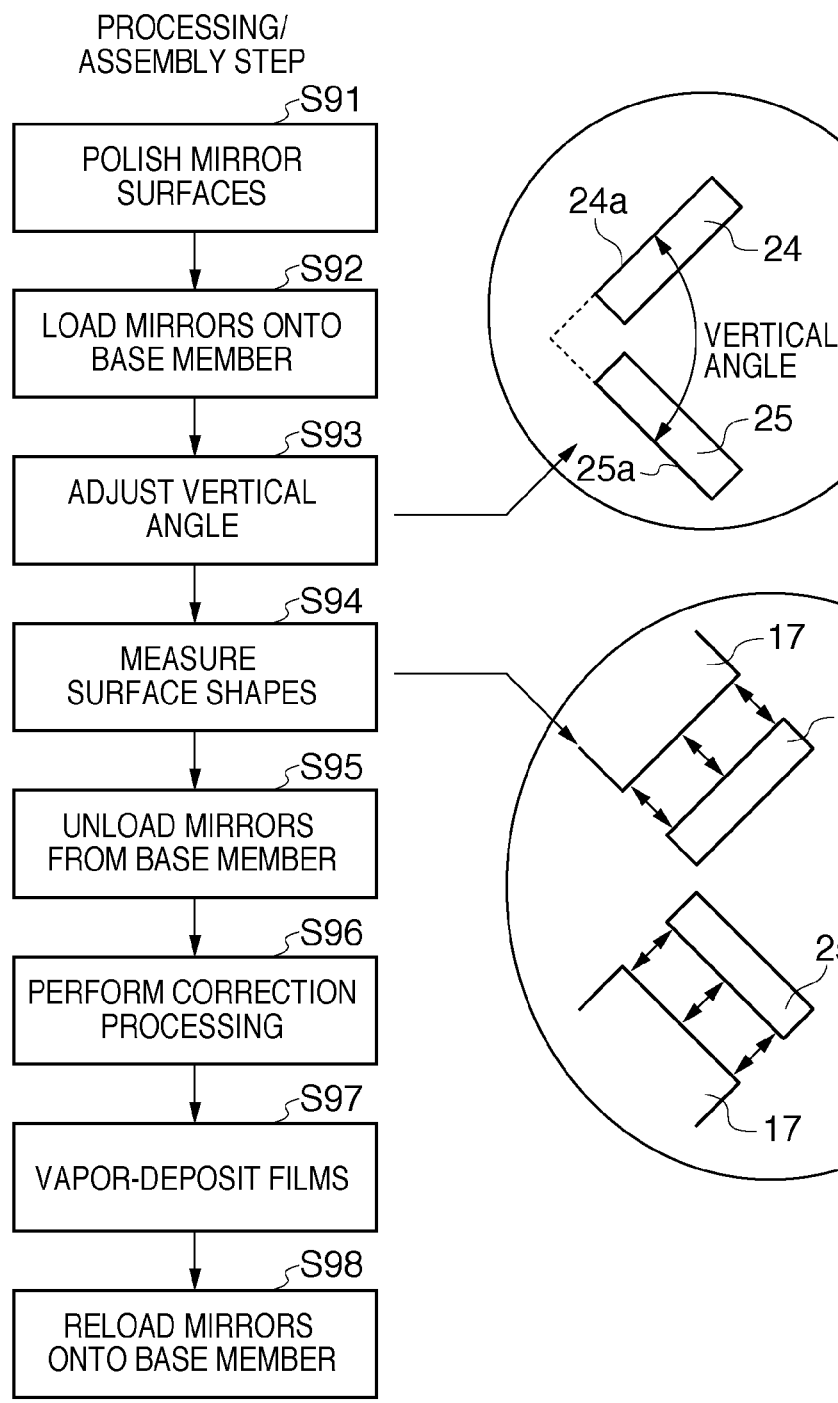
FIG. 9 is a flowchart illustrating a method of manufacturing the mirror assembly.

A method of manufacturing the mirror assembly MA will be explained with reference to FIG. 9. The mirror assembly MA is manufactured so as to satisfy (Target 1) and (Target 2) while the supporting mechanism S supports the first mirror member 24 and second mirror member 25:

(Target 1) The angle between the first reflecting surface 24a of the first mirror member 24 and the second reflecting surface 25a of the second mirror member 25 falls within the tolerance of a target angle (for example, 90°).

(Target 2) The flatnesses of the first reflecting surface 24a and second reflecting surface 25a fall within the tolerance of a target flatness.

In order to achieve target 1, steps S91 to S93 can be executed. More specifically, in step S91, the first reflecting surface 24a of the first mirror member 24 and the second reflecting surface 25a of the second mirror member 25 are polished. In step S92, the first mirror member 24 and second mirror member 25 are loaded onto the supporting mechanism S. In step S93, the angle of the first mirror member 24 on the upper side is adjusted with respect to the second mirror member 25 on the lower side using the adjusting mechanism 39 (see FIG. 5B).

In order to achieve target 2, steps S94 to S98 can be executed. More specifically, in step S94, while the supporting mechanism S supports the first mirror member 24 and second mirror member 25, the flatnesses of the first reflecting surface 24a of the first mirror member 24 and the second reflecting surface 25a of the second mirror member 25 are measured using a measurement device 17 such as an interferometer. In step S95, the first mirror member 24 and second mirror member 25 are unloaded from the supporting mechanism S. In step S96, projections on the first reflecting surface 24a and second reflecting surface 25a while the supporting mechanism S supports the first mirror member 24 and second mirror member 25 are cut based on the results obtained by the measurement in step S94. In step S97, films are vapor-deposited on the first reflecting surface 24a and second reflecting surface 25a. In step S98, the first mirror member 24 and second mirror member 25 are reloaded onto the supporting mechanism S. The first mirror member 24 and second mirror member 25 are fixed and positioned by supporting their weights by the supporting mechanism S. This makes it easy to unload and reload the first mirror member 24 and second mirror member 25 from and onto the supporting mechanism S.

Note that in step S95, deformation of each of the first mirror member 24 and second mirror member 25 needs to have reproducibility between the time before the first mirror member 24 and second mirror member 25 are unloaded from the supporting mechanism S in step S95 and that after they are reloaded onto the supporting mechanism S in step S98. Friction forces acting on the first mirror member 24 and second mirror member 25 can differ between the time before the first mirror member 24 and second mirror member 25 are unloaded from the supporting mechanism S and that after they are reloaded onto the supporting mechanism S.

An arrangement advantageous to make deformations of the first mirror member 24 and second mirror member 25 insensitive to changes in friction forces acting on the first mirror member 24 and second mirror member 25 will be explained with reference to FIG. 5B. A distance t2 between the first supported point 43 and the first lower surface 24b of the first mirror member 24 in the direction D preferably is 30% to 70% of a thickness t1 of the first mirror member 24 and more preferably is 50%, as shown in FIG. 5B. A target flatness is obtained when the distance t2 falls within the range of 30% to 70% of the thickness t1. Similarly, the distance between the supported point of the second mirror member 25 in its in-plane direction and the second lower surface 25b of the second mirror member 25 preferably is 30% to 70% of the thickness of the second mirror member 25 and more preferably is 50%. Under such conditions, deformations of the first mirror member 24 and second mirror member 25 become insensitive to changes in friction forces which act on the supported points of the first mirror member 24 and second mirror member 25 and can change every time the first mirror member 24 and second mirror member 25 are loaded onto the supporting mechanism S.

Figure 12:
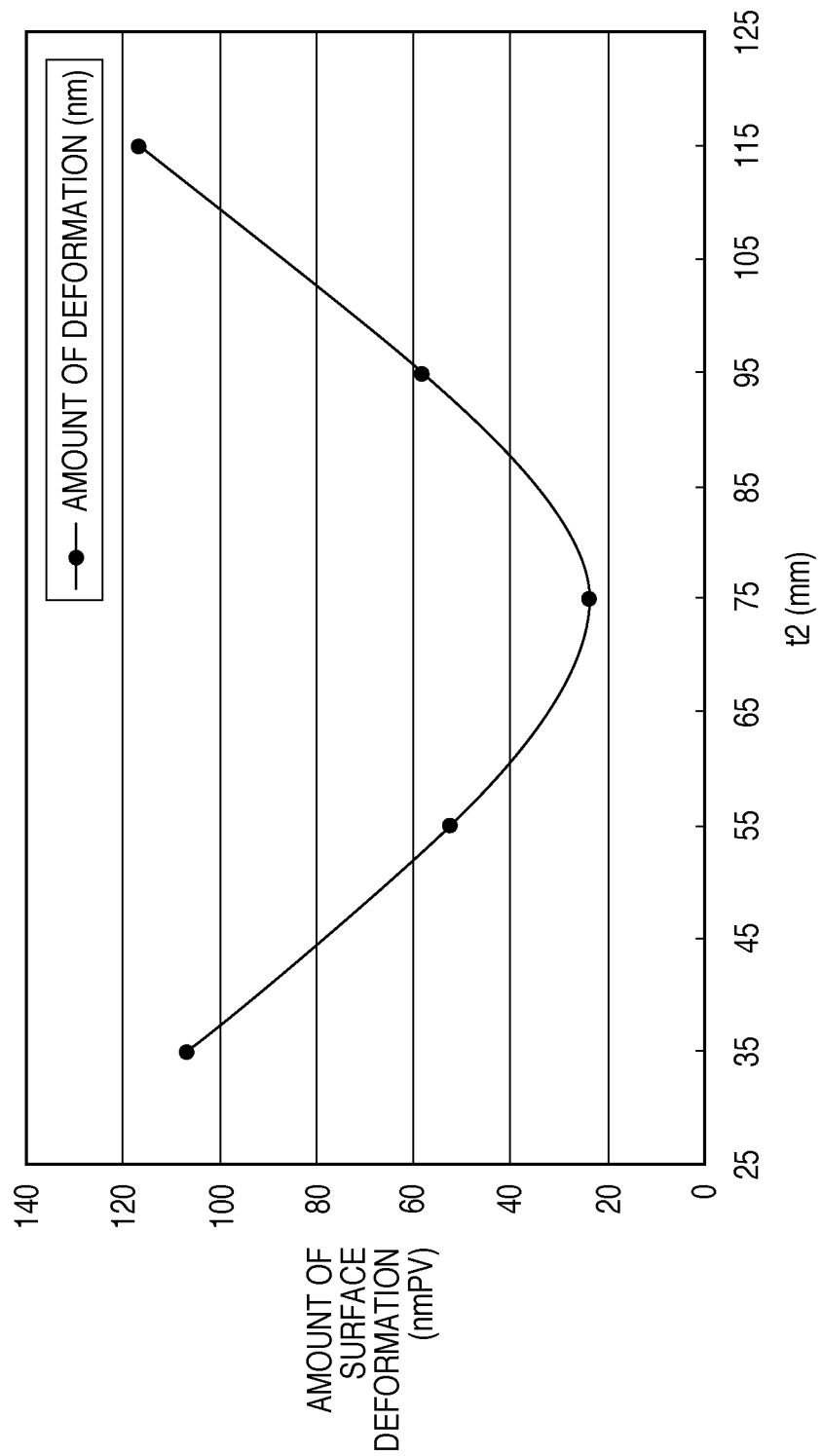
FIG. 12 is a graph showing the result of calculating the amount of deformation of the first reflecting surface of the first mirror member when a friction force acts on the first mirror member at a supported point.

FIG. 12 shows the result of calculating the amount of deformation of the first reflecting surface 24a of the first mirror member 24 when a friction force acts on the first mirror member 24 at the first supported point 43. The abscissa indicates the distance t2 between the first supported point 43 and the first lower surface 24b of the first mirror member 24 in the direction D, and the ordinate indicates the amount of deformation of the first reflecting surface 24a. Note that the first mirror member 24 has a thickness t1 of 150 mm. As is obvious from FIG. 12, the amount of surface deformation is smallest when the distance t2 is 50% of the thickness t1.

Figure 13A:
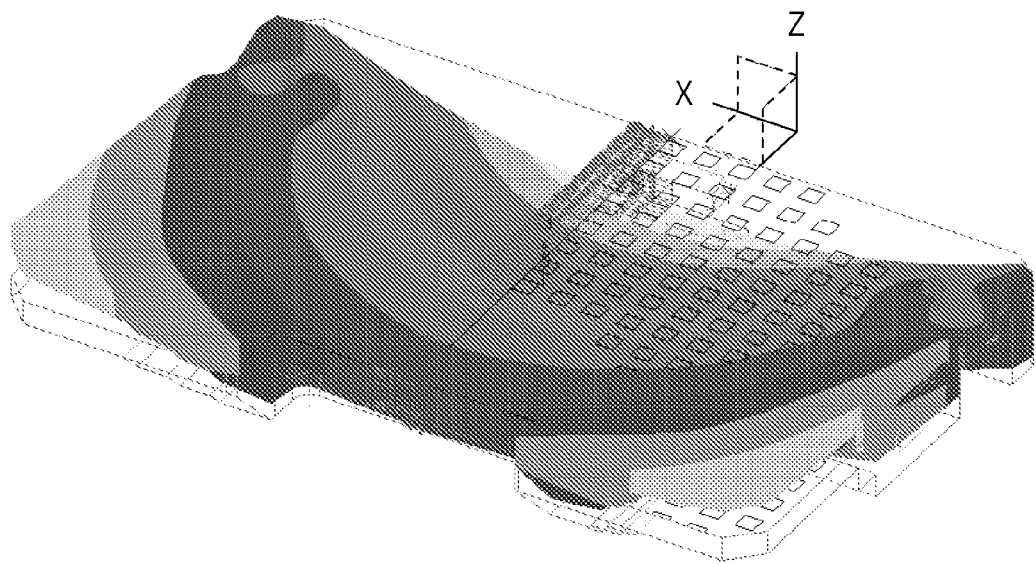
FIGS. 13A and 13B are views illustrating deformation of the first mirror member.
Figure 13B:
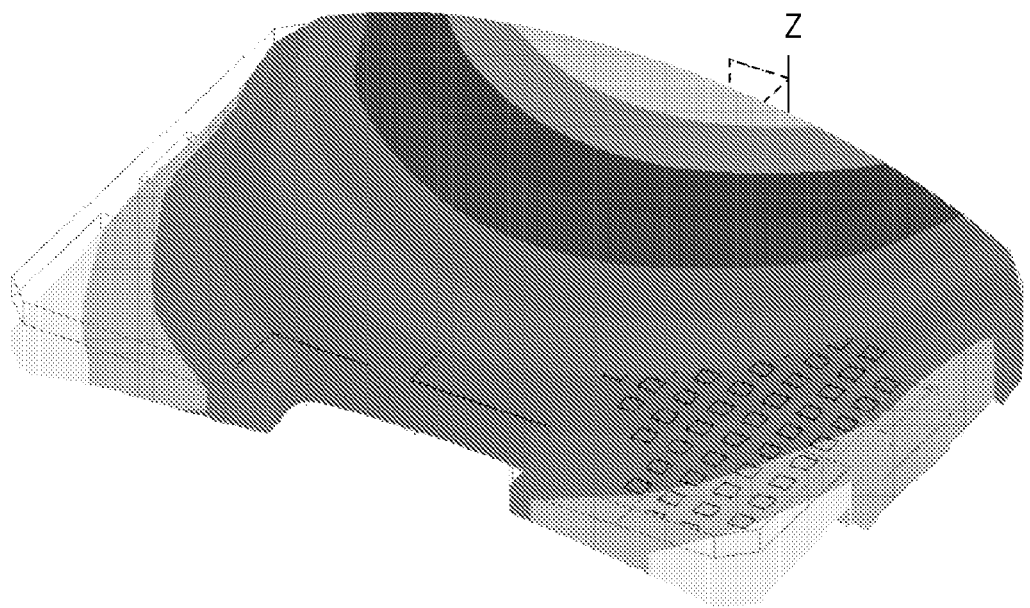

This is for the following reason. If t2>t1/2, the first mirror member 24 suffers deformation, as shown in FIG. 13A, when a friction force acts on the attachment portion 15b (first supported point 43) as indicated by an arrow F in FIG. 7. If t2<t1/2, the first mirror member 24 suffers deformation, as shown in FIG. 13B, when a friction force acts on the attachment portion 15b (first supported point 43) as indicated by the arrow F in FIG. 7. If t2=t1/2, the first mirror member 24 suffers the average deformation between the deformations shown in FIGS. 13A and 13B, and the amount of deformation is relative minimum.

In the above-mentioned embodiment, four supported points, on the upper side, of five supported points of the first mirror member 24 are located in the first recesses (that is, between the first reflecting surface 24a and the first lower surface 24b), and one lower supported point is located on the lower surface of the first mirror member 24. However, all of the five supported points may be located between the first reflecting surface 24a and the first lower surface 24b.

The shapes of the first mirror member 24 and second mirror member 25 will be explained with reference to FIGS. 7 and 8. As illustrated in FIG. 7, the first mirror member 24 preferably has notches at corner portions 61 positioned on the lower side while the supporting mechanism S supports it. Since no receptacles support the corner portions 61, it is effective to form notches to reduce the weights of the lower corner portions 61 so as to prevent flexure of the first mirror member 24. The second mirror member 25 preferably has notches at corner portions 62 positioned on the upper side while the supporting mechanism S supports it. Since no receptacles support the upper corner portions 62, it is effective to form notches to reduce the weights of the upper corner portions 62 so as to prevent flexure of the second mirror member 25. Each notch may have one or a plurality of steps, as illustrated in FIG. 7, or may have an inclined surface.

Although all components of the mirror assembly MA are preferably made of low thermal expansion materials, other materials can also be adopted when the temperature of the environment in which the mirror assembly MA is disposed is controlled precisely.

Another arrangement advantageous to make deformations of the first mirror member 24 and second mirror member 25 insensitive to changes in friction forces acting on the first mirror member 24 and second mirror member 25 will be explained with reference to FIG. 10. A distance t2 between the first supported point 44 and the first lower surface 24b of the first mirror member 24 in the direction D preferably is 30% to 70% of a thickness t1 of the first mirror member 24 and more preferably is 50%, as shown in FIG. 10. Similarly, the distance between the supported point of the second mirror member 25 in its in-plane direction and the second lower surface 25b of the second mirror member 25 preferably is 30% to 70% of the thickness of the second mirror member 25 and more preferably is 50%. Under such conditions, deformations of the first mirror member 24 and second mirror member 25 become insensitive to changes in friction forces which act on the supported points of the first mirror member 24 and second mirror member 25 and can change every time the first mirror member 24 and second mirror member 25 are loaded onto the supporting mechanism S.

A method of manufacturing a device according to a preferred embodiment of the present invention is suitable for manufacturing devices such as a semiconductor device and a liquid crystal device. The method can include a step of exposing a substrate coated with a photosensitive agent using the above-mentioned exposure apparatus, and a step of developing the exposed substrate. The method of manufacturing a device can also include other known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-132427, filed Jun. 1, 2009, which is hereby incorporated by reference herein in its entirety.

What is claimed is:

1. An exposure apparatus that projects a pattern of an original onto a substrate by a projection optical system to expose the substrate,
   the projection optical system comprising a mirror assembly including a first mirror member having a first reflecting surface which bends a light passing through the projection optical system, a second mirror member having a second reflecting surface which bends the light, and a supporting mechanism having a first supporting surface which supports the first mirror member and a second supporting surface which supports the second mirror member,
   the apparatus comprising an adjustment mechanism configured to adjust an angle of the first reflecting surface of the first mirror member and the second reflecting surface of the second mirror member,
   wherein the first mirror member is arranged such that the first reflecting surface is directed obliquely upward, the first mirror member having a first recess formed in a back side of the first reflecting surface, and a first supported point formed by a member fixed to an inner surface of the first recess,
   the second mirror member is arranged such that the second reflecting surface is directed obliquely downward, the second mirror member having a second recess formed in a side of the second reflecting surface, and a second supported point formed by a member fixed to an inner surface of the second recess,
   the first mirror member is supported by the first supporting surface of the supporting mechanism at the first supported point, and the second mirror member is supported by the second supporting surface of the supporting mechanism at the second supported point.

2. The apparatus according to claim 1, wherein weights of the first mirror member and the second mirror member are supported by the supporting mechanism and positioned with respect to the supporting mechanism.

3. The apparatus according to claim 1, wherein the first supported point is located between a plane to which the first reflecting surface belongs and a plane to which a first lower surface opposite to the first reflecting surface belongs, and the second supported point is located between a plane to which the second reflecting surface belongs and a plane to which a second lower surface opposite to the second reflecting surface belongs.

4. The apparatus according to claim 1, wherein four first supported points are formed by the member fixed to the inner surface of the first recess, and the first mirror member further has a supported point at a position lower than the four first supported points in the back side of the first lower surface.

5. The apparatus according to claim 1, wherein five second supported points are formed by the member fixed to the inner surface of the second recess.

6. The apparatus according to claim 1, wherein the projection optical system a first concave reflecting surface, a convex reflecting surface, and a second concave reflecting surface, and the first reflecting surface, the first concave reflecting surface, the convex reflecting surface, the second concave reflecting surface, and the second reflecting surface are arranged between an object plane and an image plane of the projection optical system in turn from the object plane to the image plane.

7. The apparatus according to claim 1, wherein the adjustment mechanism is configured to adjust at least one of the first supporting surface and the second supporting surface to adjust the angle.

8. An exposure apparatus that projects a pattern of an original onto a substrate by a projection optical system to expose the substrate, the projection optical system comprising a mirror assembly including a first mirror member having a first reflecting surface which bends a light passing through the projection optical system, a second mirror member having a second reflecting surface which bends the light, and a supporting mechanism having a first supporting surface which supports the first mirror member and a second supporting surface which supports the second mirror member, the supporting mechanism being positioned so as to position the first mirror member and the second mirror member while a positional relationship between the first mirror member and the second mirror member is maintained, the apparatus comprising an adjustment mechanism configured to adjust an angle of the first reflecting surface of the first mirror member and the second reflecting surface of the second mirror member, wherein the first mirror member has a first supported point between a plane to which the first reflecting surface belongs and a plane to which a first lower surface opposite to the first reflecting surface belongs, and is supported by the first supporting surface of the supporting mechanism at the first supported point, the second mirror member has a second supported point between a plane to which the second reflecting surface belongs and a plane to which a second lower surface opposite to the second reflecting surface belongs, and is supported by the second supporting surface of the supporting mechanism at the second supported point, the first mirror member has a first recess in a back side of the first reflecting surface, the first supported point being formed by a member fixed to an inner surface of the first recess, and the second mirror member has a second recess in a side of the second reflecting surface, the second supported point being formed by a member fixed to an inner surface of the second recess.

9. A method of manufacturing a device, the method comprising the steps of:

exposing a substrate using an exposure apparatus; and developing the substrate, wherein the exposure apparatus is configured to project a pattern of an original onto a substrate by a projection optical system to expose the substrate, the projection optical system comprising a mirror assembly including a first mirror member having a first reflecting surface which bends a light passing through the projection optical system, a second mirror member having a second reflecting surface which bends the light, and a supporting mechanism having a first supporting surface which supports the first mirror member and a second supporting surface which supports the second mirror member, the apparatus comprising an adjustment mechanism configured to adjust an angle of the first reflecting surface of the first mirror member and the second reflecting surface of the second mirror member, wherein the first mirror member is arranged such that the first reflecting surface is directed obliquely upward, the first mirror member having a first recess formed in a back side of the first reflecting surface, and a first supported point formed by a member fixed to an inner surface of the first recess, the second mirror member is arranged such that the second reflecting surface is directed obliquely downward, the second mirror member having a second recess formed in a side of the second reflecting surface, and a second supported point formed by a member fixed to an inner surface of the second recess, the first mirror member is supported by the first supporting surface of the supporting mechanism at the first supported point, and the second mirror member is supported by the second supporting surface of the supporting mechanism at the second supported point.

10. A method of manufacturing a device, the method comprising the steps of:

exposing a substrate using an exposure apparatus; and developing the substrate, wherein the exposure apparatus is configured to project a pattern of an original onto a substrate by a projection optical system to expose the substrate, the projection optical system comprising a mirror assembly including a first mirror member having a first reflecting surface which bends a light passing through the projection optical system, a second mirror member having a second reflecting surface which bends the light, and a supporting mechanism having a first supporting surface which supports the first mirror member and a second supporting surface which supports the second mirror member, the supporting mechanism being positioned so as to position the first mirror member and the second mirror member while a positional relationship between the first mirror member and the second mirror member is maintained, the apparatus comprising an adjustment mechanism configured to adjust an angle of the first reflecting surface of the first mirror member and the second reflecting surface of the second mirror member, wherein the first mirror member has a first supported point between a plane to which the first reflecting surface belongs and a plane to which a first lower surface opposite to the first reflecting surface belongs, and is supported by the first supporting surface of the supporting mechanism at the first supported point, the second mirror member has a second supported point between a plane to which the second reflecting surface belongs and a plane to which a second lower surface opposite to the second reflecting surface belongs, and is supported by the second supporting surface of the supporting mechanism at the second supported point, the first mirror member has a first recess in a back side of the first reflecting surface, the first supported point being formed by a member fixed to an inner surface of the first recess, and the second mirror member has a second recess in a side of the second reflecting surface, the second supported point being formed by a member fixed to an inner surface of the second recess.

\* \* \* \* \*